United States Patent [19]

Bergeron et al.

[11] 4,300,016
[45] Nov. 10, 1981

[54] SCREENED BOX

[75] Inventors: William Bergeron, Igny; Bernard Chauvet, Longjumeau, both of France

[73] Assignee: Compagnie Industrielle des Telecommunications Cit-Alcatel, Paris, France

[21] Appl. No.: 128,148

[22] Filed: Mar. 7, 1980

[30] Foreign Application Priority Data

Mar. 23, 1979 [FR] France .................. 79 07399

[51] Int. Cl.³ ............................. H05K 5/04
[52] U.S. Cl. ..................... 174/35 R; 220/4 R; 361/424
[58] Field of Search ............ 174/35 R, 35 MS; 361/424; 336/84 M; 334/85; 220/4 R, 4 F

[56] References Cited

U.S. PATENT DOCUMENTS 3,217,085 11/1965 Lindgren ............... 174/35 MS
3,311,792 3/1967 Scoville ................ 361/424
3,340,587 9/1967 Beyer .................. 174/35 MS Primary Examiner—Gerald P. Tolin
Assistant Examiner—D. A. Tone
Attorney, Agent, or Firm—Kenyon & Kenyon

[57] ABSTRACT

A screened box comprises a rigid surround defining four side walls of the box, three of which have edge portions folded towards the outside. Two screening panels are placed one on each side of the surround, each with an edge portion inserted in an inwardly directed recess on the fourth of the aforementioned side walls. The other three edge portions of the screening panels overlap the outwardly folded edge portions of the side walls of the box. Clamping bars are fitted over each folded over edge portion and the overlapping edge portion of the screening panel.

The box is intended in particular for housing electronic circuits.

6 Claims, 3 Drawing Figures

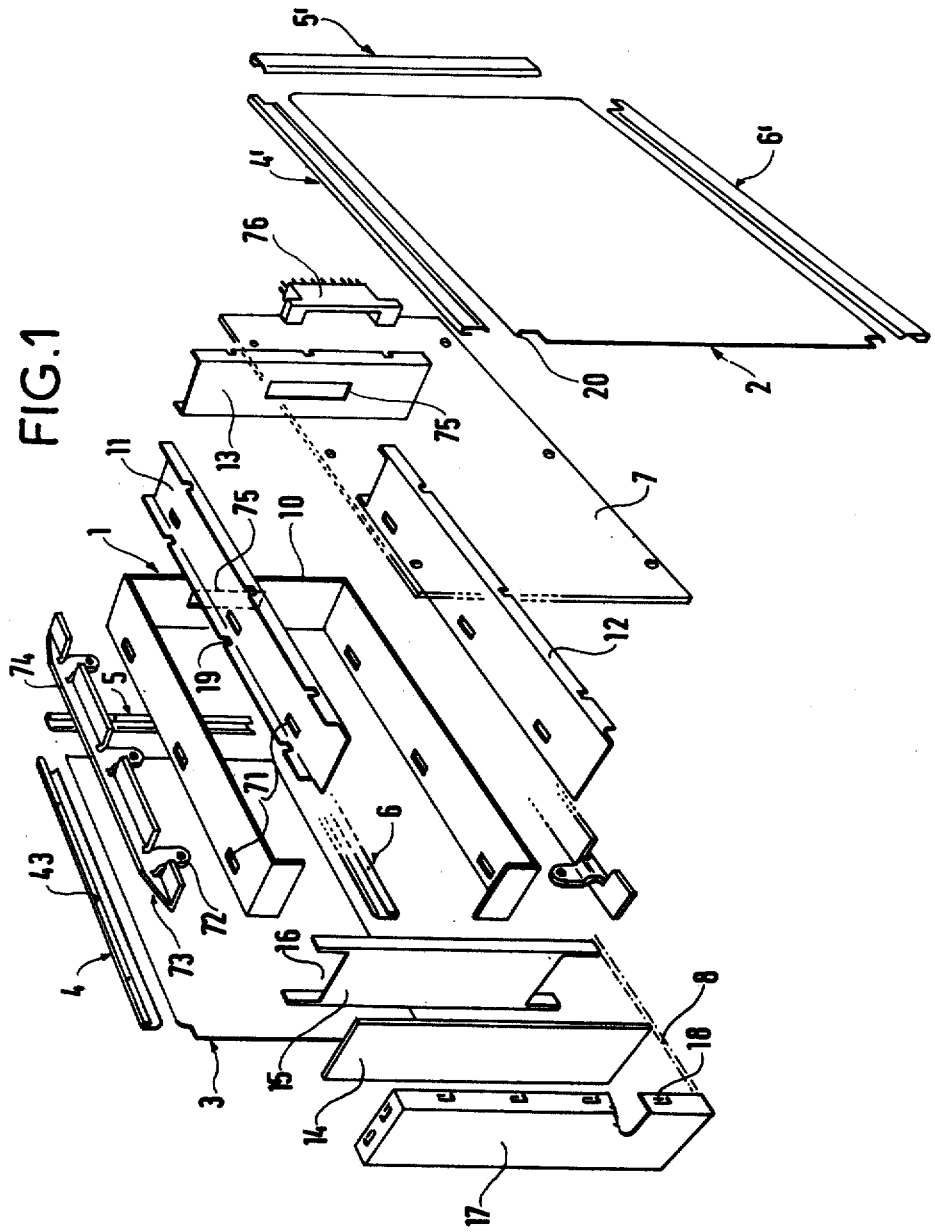

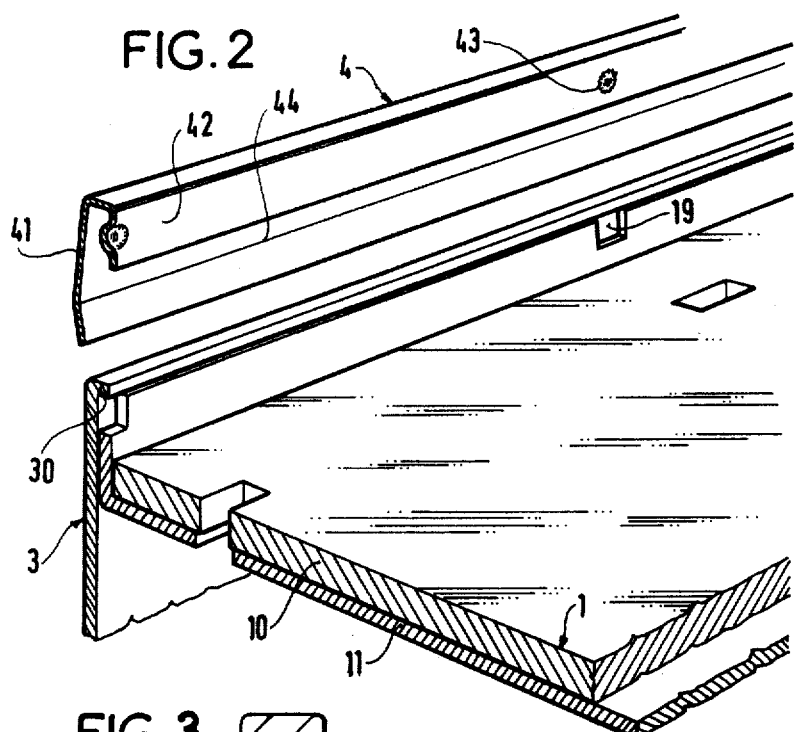
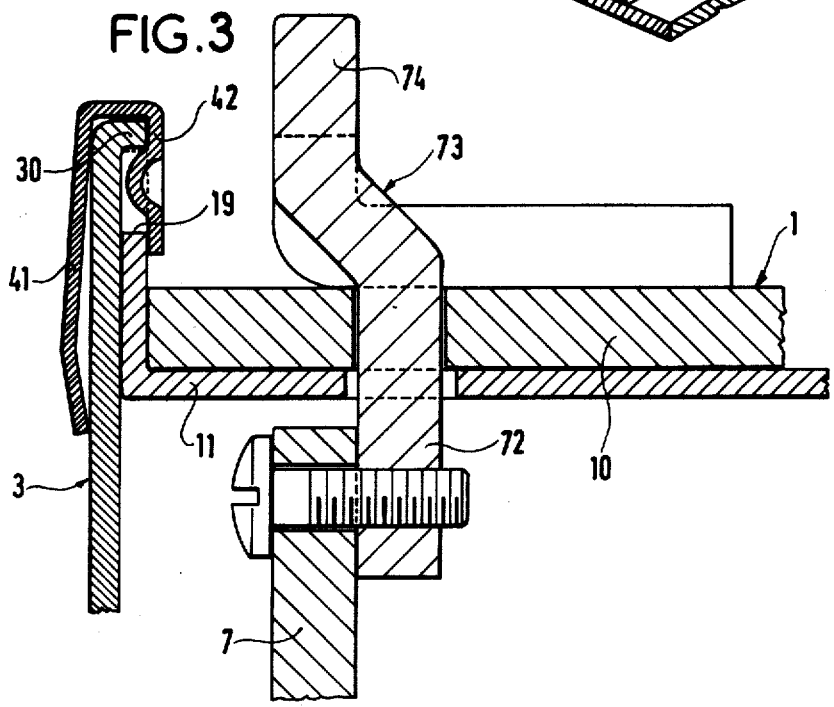

SCREENED BOX

The present invention concerns a screened box intended to contain one or more printed circuit boards carrying electronic circuits.

Such boxes are known in the art. They are of parallelpipedal shape, and one specific application is for containing circuit boards for modulators, couplers and repeaters for frequency or time multiplexed telephone links.

The boxes most commonly used are assembled from component parts which are screwed together. A typical box of this type comprises a frame including two longitudinal members stiffening the two larger side surfaces of the box, mounted between two components defining the two smaller side surfaces of the box. To these longitudinal members are attached two half-shells, one constituting the bottom and the other the top of the box. The two larger side walls of the box are attached between these half-shells and the longitudinal members. Although facilitating subsequent opening of the box, the assembly method using screws results in a relatively long assembly time. Moreover, the fixing screws and nuts, whether they project above the surfaces of the box or are countersunk in the case of sufficiently thick box components, produce an increase in the overall dimensions of the box. A further disadvantage of boxes of this type is that they are not light-tight, as the components merely overlap partially. This results in leakage of significant levels of electromagnetic energy when the circuit on the board operates in the very high frequency (VHF) range.

Also known in the art are boxes in which the component parts are assembled together by brazing or crimping. Brazing, whether using a continuous or discontinous fillet, is a difficult and lengthy procedure as compared with assembly using screws. Subsequent opening of the box is also difficult. The crimping assembly method used for small boxes requires special equipment, and the box is destroyed if it subsequently needs to be opened.

Preferred embodiments of the present invention provide a box which is easily assembled and dismantled and which, when assembled, provides electrical continuity between its component parts and a good seal against leakage of electromagnetic radiation.

The present invention consists in a screened box of parallelpipedal shape, comprising:

a rigid rectangular closed surround defining four side walls of the box, each side wall having folded edge portions, at least one of said side walls having its edge portions folded outwards and each of the remaining walls having adjacent its two edge portions respective recesses opening towards the inside of the surround;

two screening panels placed one on each side of the surround to define the top and bottom walls of the box, the edge portions of said panels overlapping said outwardly folded edge portions and engaging in said recesses; and clamping bars gripping each of said outwardly folded edge portions and the overlapping edge portion of the corresponding screening panel.

A preferred embodiment of the invention is described by way of example with reference to the accompanying drawings, in which:

FIG. 1 is an exploded view of a screened box in accordance with the invention;

FIG. 2 is a partial view of the box to a larger scale as compared with FIG. 1, showing the manner in which the walls of the box are joined together; and FIG. 3 is a partial cross-section through the box, showing in particular how the walls of the box are joined together.

Referring to FIG. 1, showing the parallelpipedal box in exploded view, the closed surround generally indicated at 1 defines the four smaller side walls of the box, and two screening panels 2 and 3 placed one on each side of the surround form the bottom and top of the box. They are attached to the surround by sets of clamping bars 4—4', 5—5' and 6—6'.

The surround 1 is formed from a number of components. It comprises a thick U-shaped component 10 bent at right angles at the base, the extremities of the two arms being bent inwardly, also at right angles. Three thin auxiliary components 11, 12 and 13 are mounted on the arms and base of the U-shaped component 10. Both longitudinal edge portions of each component are folded over.

As is seen in FIGS. 2 and 3, these three components are mounted on and welded to the internal surfaces of the U-shaped component 10. An electric arc welder may be used for this purpose, for example. Their respective outwardly folded edge portions are directed towards the outside of the component 10.

The U-shaped component 10 on which are mounted the aforementioned components 11, 12 and 13 is closed by a thick rectangular component 14 which covers and is welded to the folded extremities of the arms of the U-shaped component. A further thin auxiliary component 15 is mounted on this component 14. Its two longitudinal edge portions are folded over, whereas the two crosswise edge portions are cut back to define respective cutouts 16 corresponding to the folded extremities of the arms of the U-shaped component 10. The auxiliary component 15 is welded to the internal surface of the component 14 which closes the U-shaped component 10, with the folded edge portions of the component 15 directed towards the inside of the thus closed U-shaped component 10. A further auxiliary component 17 of rectangular shape is mounted on component 14 to form an end cap. The four edge portions of this additional component 17 are folded so as to cover and project beyond the edges of the component 14. It is attached to the component 14 by projections 18 formed by local deformation of the four folded edge portions. On the inside surface of each edge portion these projections are inclined and terminate at a sharp edge, so that the end cap is retained in position, once forced onto the component 14.

The U-shaped component 10, the three auxiliary components 11, 12 and 13, the component 14 which closes the U-shape, the associated auxiliary component 15 and the additional component 17 constitute the closed surround 1 with, on three of its walls, outwardly folded edge portions and, on its fourth wall, two recesses or housings opening towards the inside of the surround and defined between the corresponding inwardly folded edge portions of the components 15 and 17 thereof, indicated schematically at 8 by lines joining the edges of the components 15 and 17.

The three edge portions of the screening panels 2 and 3 corresponding to the folded edge portions of components 11, 12 and 13 are also folded. The folded edge 20 is clearly seen in FIG. 1 and the folded edge 30 in FIGS. 2 and 3. Each screening panel is thus held accurately in position on the surround. The unfolded edge portion is inserted between the folded edge portion of the component 17 and that of the component 15. The three other, folded edge portions of each screening panel cover the edges of the three outwardly folded edge portions of components 11, 12 and 13.

The sets of clamping bars 4—4', 5—5' and 6—6' provide the mechanical connection between the screening panels 2 and 3 and the surround 1. The bars are mounted on the folded edge portions of the surround and the corresponding folded edge portions of the screening panels. Each of the bars (such as the bar 4 shown to a larger scale in FIGS. 2 and 3) is formed from a thin narrow plate, the length of which is substantially equal to the length of the edge portions it engages. It is folded longitudinally to a channel-shape to clip over the combined thickness of the folded edge portion of the surround and the folded edge portion of the screening panel, which are thus joined together. The plate is folded at a point approximately one third across its width, so that each bar has two flanks 41 and 42 forming the sides of the channel, the height of flank 41 being substantially twice that of the other flank 42. The height of the flank 42 is slightly less than that of the folded edge portion of the surround against which it is mounted. The flank 42 is formed with inwardly directed projections 43 which engage notches 19 formed in the folded over edge portions of the components 11, 12 and 13 of the surround 1. Flank 41 overlies the screening panel 3 and is curved along its length so as to urge its longitudinal edge against the screening panel to promote an effective clamping action on the edge portions of the surround and the screening panel. This curve is obtained by means of a longitudinal fold 44. With the bar 4 mounted on the edge portions of the surround and the screening panel, the free longitudinal edge of flank 41 bears against the screening panel while the projections 43 engage and lock in the notches 19. As shown, these notches 19 are rectangular and open on one side. This fourth side is closed when the screening panels are fitted to the surround by the corresponding portions of the folded edge portions of the screening panels.

Bars 4-4', 5-5' and 6-6' are fitted in a similar manner to the edge portions of the surround and screening panels which they fix together.

As one particular use for the box constructed as described is to contain one or more printed circuit boards such as the board 7 shown in FIGS. 1 and 3, the surround 1 is formed with orifices or windows 71, in this instance on the two longer walls defined by the arms of the U-shaped component 10 and the associated components 11 and 12. On each wall the windows 71 are aligned in a row. These windows enable fixing lugs 72 on a terminal strip 73 on each of the two side walls to penetrate into the box. The printed circuit board is supported on the surround 1 by screwing it to the fixing lugs 72. By appropriately positioning the row of windows on each wall the circuit board may be positioned parallel to the screening panels and at a required distance from one panel.

As shown, the two terminal strips 73 also form a pair of guide rails 74 used to insert the box into a rack fitted with complementary guides.

One of the two other side walls defined by the surround, in this instance that formed by the base of the U-shaped component 10 and the associated component 13, is also formed with a window 75 (see FIG. 1) through which passes an electrical connector 76 attached to the board 7.

Thus as will be seen from the foregoing description, the box according to the invention is easily and quickly assembled and dismantled, requiring no auxiliary equipment. The interconnection of the component parts using clamping bars as described does not limit the usable internal volume of the box and only slightly increases the overall dimensions of the box, by the height of the folded edge portions of the surround. Moreover, the overlapping contact between the various components created by the bars extending along the length of each joint provide excellent protection against leakage of electromagnetic radiation and also provides excellent electrical continuity over the entire periphery of the box. This makes the box particularly suited to containing electronic circuits operating at high frequencies.

The present invention has been described with reference to the preferred embodiment shown in the drawings. It will nevertheless be apparent that other embodiments may be deduced from that shown without departing from the scope of the invention. For example, in the embodiment as described three of the four smaller side walls of the box have two edge portions folded outwards. In alternative embodiments, two or even one only of the four smaller side walls could have edge portions folded outwards with the remaining side walls having their edge portions folded inwards and cooperating with additional components like component 17 in FIG. 1 forming end caps and defining inwardly directed recesses into which the corresponding edge portions of the screening panels would slide. The final interconnection of the components of the box would be provided by clamping bars mounted on each outwardly folded edge portion and the corresponding folded edge portion of the overlapping screening panel.

The described embodiment and alternative embodiments deduced therefrom may also be modified in matters of detail without departing from the scope of the invention. For example, the notches 19 on the outwardly folded edge portions, as described of rectangular or square cross-section, might instead be of different shape. It is also possible to eliminate the need for an additional auxiliary component (17) associated with each inwardly folded edge portion of a wall by forming the recess solely in the thickness of the side wall in question (component 14) adjacent each of its two longitudinal edges. A groove opening towards the inside of the surround or box would overlap the corresponding screening panel to provide protection against leakage of electromagnetic radiation.

We claim:

1. A screened box of parallelpipedal shape, comprising:
    a rigid rectangular closed surround defining four side walls of the box, each side wall having folded edge portions with at least one of said side walls having its edge portions folded outwards and each of the remaining walls having adjacent its two edge portions respective recesses opening towards the inside of the surround;
    two screening panels placed one on each side of the surround to define the top and bottom walls of the box, the edge portions of said panels overlapping said outwardly folded edge portions and engaging in said recesses; and clamping bars gripping each of said outwardly folded edge portions and the overlapping edge portion of the corresponding screening panel.

2. A screened box according to claim 1, wherein said surround comprises a thick U-shaped first component closed by a second component welded to the arms of the U, and in that it also supports four thin auxiliary components with lengths corresponding to the lengths of the base, arms and opposite side, respectively, of the U, each auxiliary component being welded to the internal surfaces of the assembled first and second components defining said side walls of the box, at least one auxiliary component having its edge portions folded outwards and the remaining auxiliary components having their edge portions folded inwards, a further thin auxiliary component being fitted to each wall with inwardly folded edge portions and having its edge portions folded towards the inside of the surround to define, in conjunction with the edge portions of the wall to which it is fitted, said recesses.

3. A screened box according to claim 1, wherein each bar is folded to a channel shape from flat sheet and fits over the outwardly folded edge portion of the corresponding side wall of the box and the overlapping screening panel, a first flank of the bar overlying said folded edge portion and having a height substantially equal to the height thereof, the second flank being curved and overlying the edge portion of the screening panel, applying pressure thereto.

4. A screened box according to claim 3, wherein the height of said second flank is substantially twice that of said first flank.

5. A screened box according to claim 3, wherein said first flank has inwardly directed projections and in that the outwardly folded edge portion receiving the bar has notches engaging said projections.

6. A screened box according to any one of claims 1 to 5, wherein each screening panel has a turned over edge portion overlapping each outwardly folded edge portion of the corresponding side wall of the box and the edge thereof.

* * * * *